United States Patent [19]
Harada

[11] Patent Number: 5,260,600
[45] Date of Patent: Nov. 9, 1993

[54] SEMICONDUCTOR DEVICE HAVING PROTECTIVE INSULATING FILM

[75] Inventor: Shigeru Harada, Hyogo, Japan

[73] Assignee: Mitsubishi Denki Kabushiki Kaisha, Tokyo, Japan

[21] Appl. No.: 704,422

[22] Filed: May 23, 1991

[30] Foreign Application Priority Data

Jun. 5, 1990 [JP] Japan .................................. 2-148185

[51] Int. Cl.$^5$ .......................................... H01L 23/28
[52] U.S. Cl. ..................................... 257/639; 257/635
[58] Field of Search .................. 357/54, 72, 71, 23.15, 357/15; 427/255.2, 40; 257/411, 787, 633, 635, 639

[56] References Cited

U.S. PATENT DOCUMENTS

| | | | |
|---|---|---|---|
| 4,091,407 | 5/1978 | Williams et al. | |
| 4,097,889 | 6/1978 | Kern et al. | |
| 4,782,032 | 11/1988 | Geissberger et al. | 357/15 |
| 4,877,641 | 10/1989 | Dory | 427/255.2 |
| 4,981,724 | 1/1991 | Hochberg et al. | 427/255.2 |
| 5,040,046 | 8/1991 | Chhabra et al. | 357/54 |

FOREIGN PATENT DOCUMENTS 2747474 5/1978 Fed. Rep. of Germany .

OTHER PUBLICATIONS

Applications of Plasma Processes to VLSI Technology—T. Sugano, John Wiley & Sons New York (1985) S. 185-202.

Amorphous Silicon Thin Film Transistors with $SiO_x$-$N_y$/$SiN_x$ gate insulators, Kouichi Hiranaka et al, Jap. J. Appl. Phys. Bd. 29 (1990) S. 229-235.

Plasma TEOS as an Intermetal Dielectric in Two Level Metal Technology, Graham W Hills, Solid State Technol. (Apr. 1990) H. 4 S. 127-132.

Ion Bombardment: A Determining Factor in Plasma CVD, H. P. W. Hey et al, Solid State Technol. (Apr. 1990) H. 4 S. 139-144.

R. J. Usell, et al., "Experimental and Mathematical Determination of Mechanical Strains Within Plastic IC packages and their Effect on Devices During Environmental Tests", IEEE Proceedings, 1981, pp. 65-73.

S. Okikawa et al., "Stress Analysis of Passivation Film Crack for Plastic Molded LSI Caused by Thermal Stress", International Symposium for Testing and Failure Analysis, 1983, pp. 275-280.

D. R. Edwards, et al., "Shear Stress Evaluation of Plastic Packages", IEEE (Texas Instruments, Inc.), pp. 84-95.

Primary Examiner—Rolf Hille
Assistant Examiner—Roy Potter
Attorney, Agent, or Firm—Lowe, Price, LeBlanc & Becker

[57] ABSTRACT

A semiconductor device having a protective insulating film is disclosed. This semiconductor device includes a semiconductor substrate, and an interconnection pattern provided on said semiconductor substrate and electrically connected with said elements. A silicon-oxy-nitride film is provided on said semiconductor substrate so as to cover said interconnection pattern. The silicon-oxy-nitride film is deposited in accordance with a chemical vapor deposition Method using plasma, using a mixture gas including organic silane and a nitriding gas and has therefore superior step coverage. The silicon-oxy-nitride film has a superior barrier characteristic to moisture coming in from the outside. A semiconductor device superior in reliability such as moisture resistance is thus obtained.

11 Claims, 16 Drawing Sheets

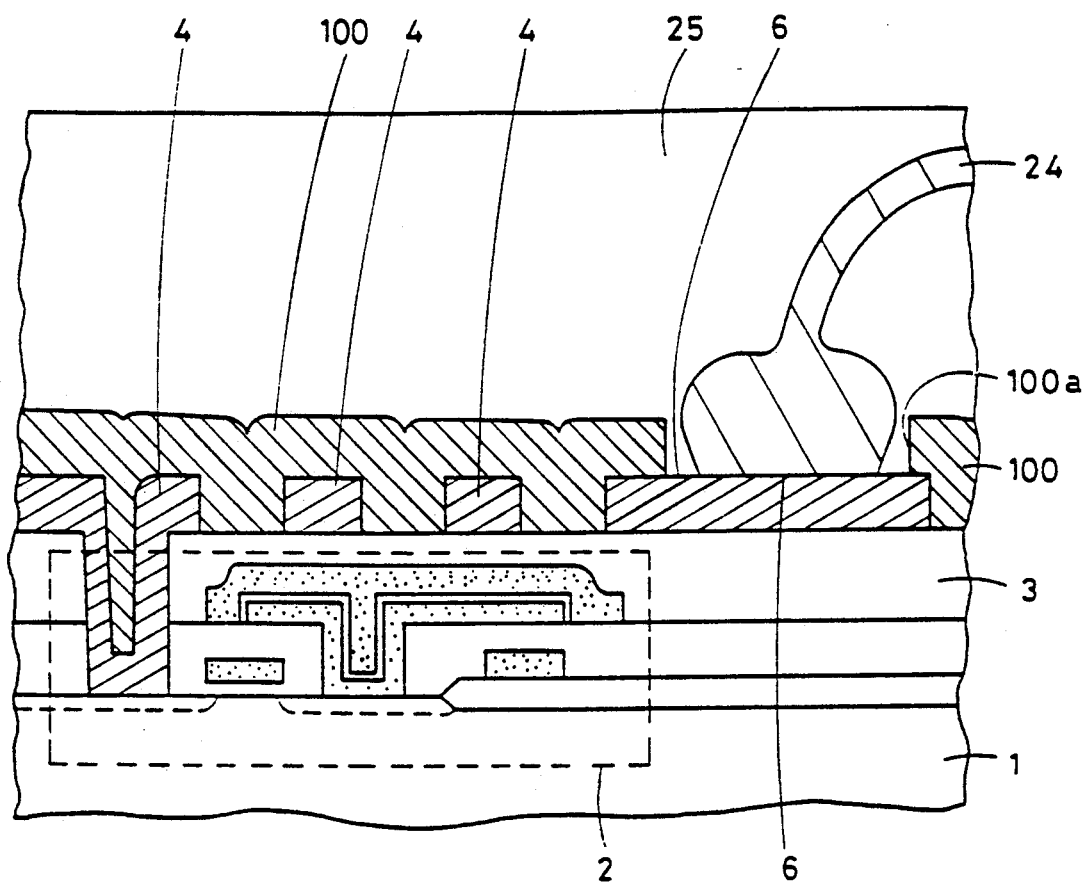

SEMICONDUCTOR DEVICE HAVING PROTECTIVE INSULATING FILM

BACKGROUND OF THE INVENTION

1. Field of the Invention

The present invention relates generally to semiconductor devices, and in particular, to a semiconductor device in which its elements are covered with a protective insulating film in order to prevent the elements from being changed due to extraneous factors in the environment such as moisture, stress, etc. The present invention further relates to the manufacturing method of such a semiconductor device.

2. Description of the Background Art

In a semiconductor device, after formation of elements on a semiconductor substrate, the elements are covered with a protective insulating film, and then housed into a mold resin package or a ceramic package in order to prevent the effect of extraneous factors in the environment such as moisture, stress, etc.

FIG. 1 is a sectional view of a conventional mold resin sealed semiconductor device. FIG. 2 is an enlarged view of A part in FIG. 1.

Referring to FIG. 1, a chip 21 is provided on a die pad 23a. On the chip 21 formed are elements. An electrode of the chip 21 and a lead 23b are electrically connected by a bonding wire 24. The die pad 23a together with the lead 23b are referred to as a lead frame 23. On the chip 21 formed is a protective insulating film 5. The chip 21 is sealed by mold resin sealing agent 25.

Referring to FIG. 2 further detailed description will be provided on the structure of the above-described chip. In the following, a DRAM (Dynamic Random Access Memory) device will be described as an example. A DRAM element 2 (stacked capacitor cell) is formed on the surface of a silicon semiconductor substrate 1. On the DRAM element 2 deposited is a first insulating layer 3. A first interconnection 4 is formed on the first insulating layer 3. A protective insulating film 5 is deposited to cover the first interconnection 4. The protective insulating film 5 is provided with an opening 5a for exposing a bonding pad 6. The bonding wire 24 is connected to the bonding pad 6 to connect the external lead 23b and the first interconnection 4.

Now, description will be provided on the manufacturing method of the DRAM device shown in FIG. 2 in conjunction with FIGS. 3A–3F.

Although multi-interconnection structures are generally known as interconnection structures which are formed of polysilicon interconnections, high melting point metal silicide interconnections, high melting point metal interconnections, aluminum interconnections, etc., the case shown in FIG. 2 in which the first interconnection 4 is of an aluminum interconnection and of a single layer interconnection structure will be described in the following by way of simplification.

Referring to FIG. 3A, the DRAM element (stacked capacitor cell) 2 is formed by providing an oxide film for element isolation 301, a transfer gate electrode 302, an impurity diffusion layer 303, a word line 304, a storage node 305, a capacitor insulating film 306 and a cell plate 307 on the surface of a silicon semiconductor substrate 1.

Now, referring to FIG. 3B, a first insulating film 3 is deposited onto the surface of the silicon semiconductor substrate 1 on which the DRAM element 2 is formed. Then, a contact hole 308 is formed in a desired part in the first insulating film 3 by a photolithography method and an etching method. An aluminum interconnection to be a first interconnection is formed as a bit line. The first interconnection 4 includes the bonding pad 6.

Referring to FIG. 3C, a silicon oxide film, i.e. the protective insulating film 5 is deposited onto the surface of the silicon semiconductor substrate 1 by using a Chemical Vapor Deposition method (CVD method hereinafter) using, for example, a silane SiH$_4$) gas and a nitrous oxide (N$_2$O) gas at a film deposition temperature ranging from 300°–450° C. and using heat or plasma.

Referring to FIG. 3D, the opening 5a is formed in the protective insulating film 5 by a photolithography method or an etching method for exposing the bonding pad 6 to perform wire bonding.

Now, referring to FIGS. 1 and 3E, the semiconductor substrate 1 with the elements formed thereon is severed by dicing to be the semiconductor chip 21. The semiconductor chip 21 is then adhesive-bonded to the die pad 23a of the lead frame 23 by soldering or with conductive resin. Then, the bonding pad 6 and the lead 23b of the lead frame are connected by the bonding wire 24.

Referring to FIG. 3F, finally the device is entirely packaged by the mold resin sealing agent 25.

Other than the above-described silicon oxide film, a silicon nitride film formed by a CVD method using silane and nitride or ammonia, a silicon-oxy-nitride film formed by a CVD method using nitrous oxide, and the layered structure of these films, etc. are used as a protective insulating film.

The conventional mold resin sealed semiconductor device structured as described above possesses the following problems.

With development of higher performance semiconductor devices, the area of the semiconductor chip 21 in FIG. 4 tends to be larger. When packaging a semiconductor chip having such a large area, as shown in FIG. 4, compressive stress 26 created by the mold resin 25 gives rise to a problem. In other words, the compressive stress 26 of the mold resin 25 is applied to the surface of the semiconductor chip 21, and, therefore, the first interconnection 4 (aluminum interconnection) is mechanically deformed (sliding phenomenon of the aluminum interconnection) as shown in FIG. 5 (an enlarged view of A part in FIG. 4), thereby producing a crack 8 in the protective insulating film 5. The existence of such a crack in the protective insulating film 5 permits moisture 9 entering through the mold resin 25 from the outside to reach all the way to the first interconnection 4, thereby corroding the first interconnection 4. Such a corroded portion 10 degrades the reliability such as moisture resistance, etc. of the semiconductor device.

One solution to such a problem is to increase the mechanical strength of the step portion of the first interconnection 4 to a level sufficient to tolerate the compressive stress 26 of the mold resin 25. In a silicon oxide film of silane type deposited in a conventional method, e.g. a plasma CVD silicon oxide film of SiH$_4$+N$_2$O type, a film deposition reaction (in accordance with a method of forming a film in which film components are formed by a reaction in vapor and are deposited on a substrate) takes place mainly in layers, and, therefore, the step coverage at the step portion 31 of the first interconnection 4 is poor. As shown in FIG. 6B, even with a protective insulating film 32 being deposited to be thick (1 μm), the step coverage is not good so that the film thickness of the step portion 33 of the first interconnection 4 cannot be made large enough. This method cannot therefore be employed as a solution for the above described problem.

This applies to other cases in which a silicon nitride film deposited with silane, a silicon-oxy-nitride film, etc. are used.

Recently, use of a plasma CVD . silicon oxide film using tetra ethoxy silane (TEOS) and oxygen as a film having a superior step coverage has been reported, but a resultant film is a silicon oxide film which is not as fine as a silicon nitride film or a silicon-oxy-nitride film used conventionally as a protective insulating film. The film is therefore inferior in terms of a barrier characteristic to moisture coming in from the outside, and cannot tolerate compressive stress by mold resin. The silicon oxide film is therefore insufficient in terms of mechanical strength.

One object of the present invention is to improve the step coverage of a protective insulating film in a semiconductor device having a protective insulating film.

Another object of the present invention is to provide an improved semiconductor device having a protective insulating film to tolerate compressive stress by mold resin.

A further object of the present invention is to provide a semiconductor device having a protective insulating film which has improved reliability such as moisture resistance.

Yet another object of the present invention is to provide a manufacturing method of a semiconductor device improved to tolerate compressive stress by mold resin and having an improved reliability level such as moisture resistance.

In order to achieve the above-described objects, a semiconductor device in accordance with the present invention includes a semiconductor substrate on which elements are formed, a patterned interconnection provided on said semiconductor substrate and electrically connected with said elements, and a silicon-oxy-nitride film provided on said semiconductor substrate so as to cover said interconnection pattern. The above described silicon-oxy-nitride film is deposited in a CVD method using plasma, using a mixture gas including an organic silane gas and a nitriding gas.

In accordance with a preferred embodiment of the present invention, the above-described silicon-oxy-nitride film is formed at a film formation temperature in the range of 300°–450° C. under a film formation pressure in the range from 10–100 Torr.

In a semiconductor device in accordance with the present invention, a protective insulating film is formed of a silicon-oxy-nitride film deposited by a CVD method using plasma, using gas including an organic silane gas and a nitriding gas. The silicon-oxy-nitride film has superior step coverage because its film deposition reaction (specific to a film formation process using organic silane) takes place mainly on the surface of the substrate. When depositing the above-described silicon-oxy-nitride film on the interconnection pattern, the film thickness of the protective insulating film is not formed to be thin in the step portion. Consequently, the mechanical strength of the protective insulating film can be increased to a level sufficient to tolerate compressive stress by the mold resin. The mechanical deformation of the interconnection pattern or the formation of cracks in the protective insulating film in accordance with the deformation can thus be prevented.

Also, the insulating film including a silicon-oxy-nitride film including N atoms having a small radius, is finer than a silicon oxide film, thereby providing a high barrier characteristic to moisture coming in from the outside. A semiconductor device having superior reliability such as moisture resistance, etc. is thus provided.

A semiconductor device in accordance with another aspect of the present invention includes a semiconductor substrate on which elements are formed, an interconnection pattern provided on said semiconductor substrate and connected electrically with said elements, and a silicon-oxy-nitride film provided on said semiconductor substrate so as to cover said interconnection pattern and including 0.01–0.5 wt % of hydroxyl group.

The manufacturing method of a semiconductor device in accordance with a further aspect of the present invention includes the steps of forming elements on a semiconductor substrate, forming an interconnection pattern connected electrically with said elements on said semiconductor substrate, and depositing a silicon-oxy-nitride film on the above interconnection pattern. The said silicon-oxy-nitride film is deposited by a CVD method using plasma by using a mixture gas including an organic silane gas and a nitriding gas at a film formation temperature in the range from 300° to 450° C. under a film formation pressure in the range from 10 to 100 Torr.

In accordance with the manufacturing method of the semiconductor device of the present invention, superior step coverage is provided because a film deposition reaction (specific to a film formation reaction using organic silane) takes place mainly on the surface of the substrate. Therefore, when depositing the film on the interconnection pattern, the protective insulating film is not formed to be thin in the step portion. Consequently, the mechanical strength of the protective insulating film can be increased to a level sufficient to tolerate compressive stress by the mold resin. The protective insulating film formed in accordance with the method, being a silicon-oxy-nitride film, is therefore finer than a silicon oxide film, and, therefore, provides a superior barrier characteristic to moisture coming in from the outside. A semiconductor device having superior reliability such as moisture resistance can thus be provided.

BRIEF DESCRIPTION OF THE DRAWINGS

FIG. 7 is a sectional view of a semiconductor device in accordance with one embodiment of the present invention;

DESCRIPTION OF THE PREFERRED EMBODIMENTS

Now, description will be provided on one embodiment of the present invention in conjunction with the drawings. FIG. 7 is a sectional view showing a semiconductor device in accordance with one embodiment of the present invention.

Figure 11:
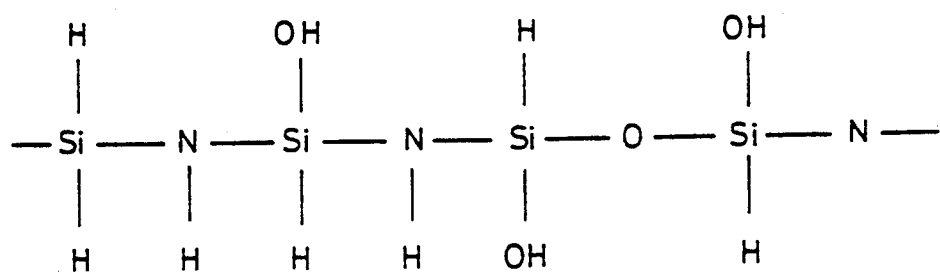
FIG. 11 is a chemical structural formula representing a silicon-oxy-nitride film produced in accordance with the present invention.

A DRAM element 2 (stacked capacitor cell) is formed on the surface of a silicon semiconductor substrate. A first insulating film 3 is formed so as to cover the DRAM element 2. Formed on the first insulating film 3 formed is the pattern of a first interconnection 4. The pattern of the first interconnection 4 includes a bonding pad. A protective insulating film 100 is formed on the first insulating film 3 so as to cover the pattern of the first interconnection 4. The protective insulating film 100 is a silicon-oxy-nitride film deposited in accordance with a CVD method employing plasma, using gas including organic silane and a nitriding gas. It is confirmed by infrared spectrum that the silicon-oxy-nitride film 100 formed in accordance with the method is represented by the chemical structural formula as shown in FIG. 11 and includes 0.01–0.5 wt % of hydroxyl group. The silicon-oxy-nitride film 100 has superior step coverage because film deposition reaction (which will be described in detail in the following) which is one characteristic of the film formation process using organic silane takes place mainly on the surface of the substrate. Referring to FIG. 7, when depositing the protective insulating film on the first interconnection 4, the thickness of the film is not therefore formed to be thin at the step portion. The protective insulating film 100 is provided with an opening 100a for exposing the bonding pad 6. Connected to the bonding pad 6 is a bonding wire 24 for connecting the lead of a lead frame. The semiconductor device is entirely mold-packaged by mold resin sealing agent 25.

As described above, referring back to FIG. 7, in depositing the protective insulating film 100 on the first interconnection 4, the thickness of the film is not formed to be thin at the step portion because the protective insulating film 100 has superior step coverage. As a result, the mechanical strength of the protective insulating film 100 can be increased to a level sufficient to tolerate compressive stress by the mold resin sealing agent 25. Consequently, the mechanical deformation of the first interconnection 4 and cracks produced in the protective insulating film 100 due to the deformation can be prevented.

The protective insulating film 100, including a silicon-oxy-nitride film including nitrogen atoms having a small radius, is finer than a silicon oxide film. As a result, the protective insulating film 100 has a superior barrier characteristic to moisture coming in from the outside. The semiconductor device having superior reliability such as moisture resistance can thus be provided.

Now, description will be provided on the manufacturing method of the semiconductor device shown in FIG. 7 in conjunction with FIGS. 8A–8F.

Figure 8A:
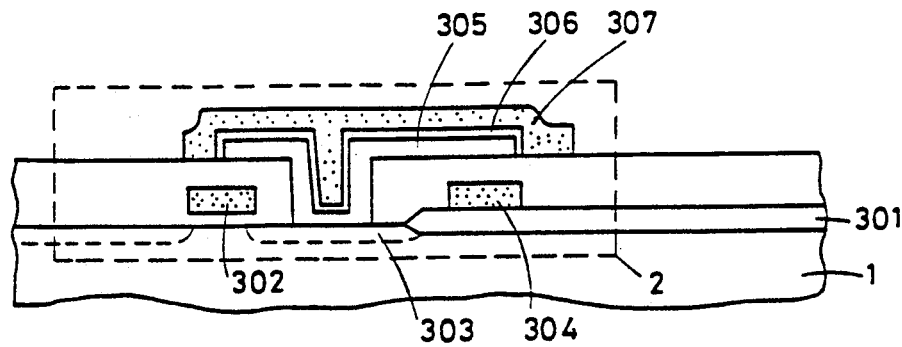
FIGS. 8A–8F are partially sectional views each showing the semiconductor device shown in FIG. 7 in each step of the manufacturing method thereof sequentially.

Referring to FIG. 8A, formed on the surface of a silicon semiconductor substrate 1 is a DRAM element 2 (stacked capacitor cell) formed of an oxide film 301 for element isolation, a transfer gate electrode 302, an impurity diffusion layer 303, a word line 304, a memory node 305, a capacitor insulating film 306, and a cell plate 307.

Figure 8B:
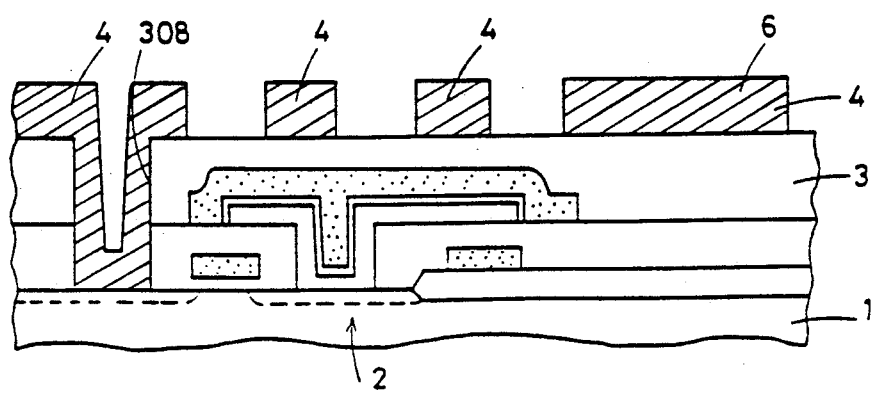

Referring to FIG. 8B, a first insulating film 3 is deposited entirely over the surface of a silicon semiconductor substrate 1 including a DRAM element 2 thereon. A contact hole 308 is provided in a desired position in the first insulating film 3 by photolithography and etching methods. Then, a first interconnection 4 being an aluminum interconnection is formed as a bit line. The first interconnection 4 includes a bonding pad 6.

Figure 8C:
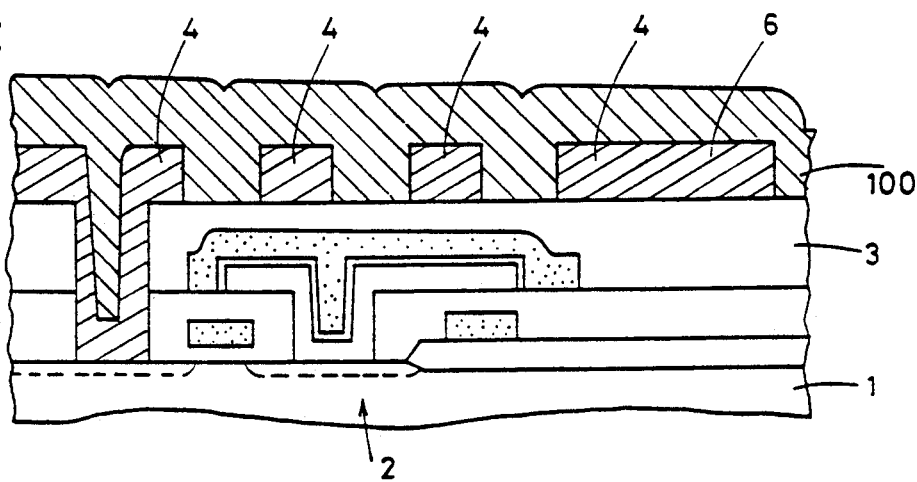

Referring to FIG. 8C, using tetra etoxy silane (TEOS) which is a kind of organic silane and ammonia and nitrogen gases (nitrogen gas is a carrier gas) which are both nitriding gases, a silicon-oxy-nitride film 100 is deposited so as to cover the first interconnection 4 by a CVD method using plasma. Hereinafter, the silicon-oxy-nitride film 100 will be called as "TEOS+NH$_3$+N$_2$ plasma CVD silicon-oxy-nitride film".

The "TEOS+NH$_3$+N$_2$ plasma CVD silicon-oxy-nitride film" is characterized by its superiority in step coverage compared to a process using silane (SiH$_4$), because a large part of film deposition reaction, which is one characteristic of the process of film formation using organic silane, takes place on the surface of the substrate.

Further description will be given on the reason why "TEOS+NH$_3$+N$_2$ plasma CVD silicon-oxy-nitride film" is superior in step coverage.

Figure 10:
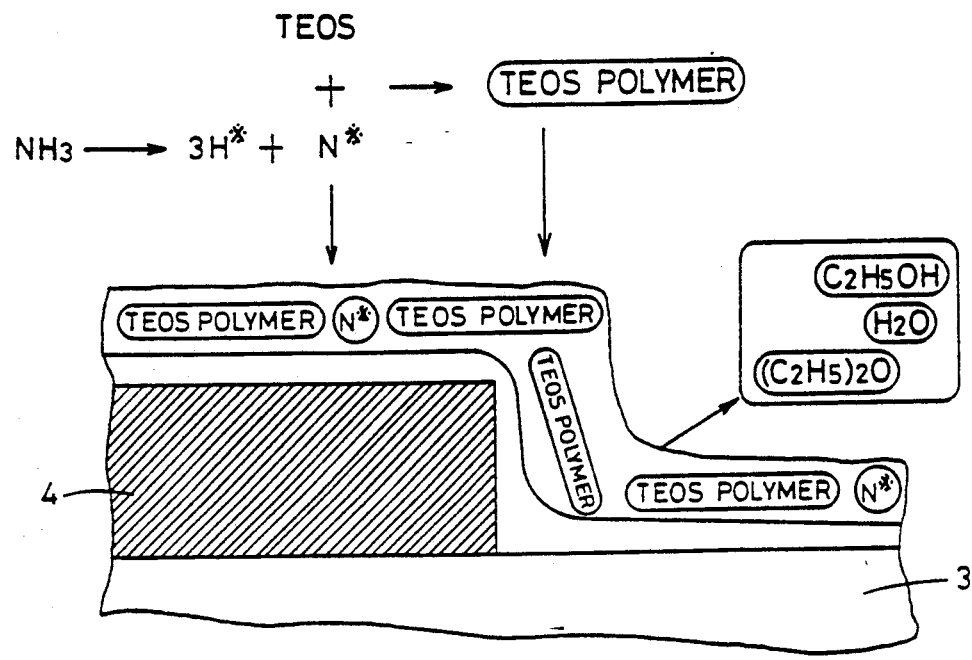
FIG. 10 is a view schematically showing how a silicon-oxy-nitride film is formed in accordance with a plasma CVD method using TEOS/NH$_3$/N$_2$.

FIG. 10 is a view schematically showing how a silicon-oxy-nitride film is formed in accordance with the plasma CVD method using TEOS/NH$_3$/N$_2$. In reaction of TEOS and NH$_3$, NH$_3$ first decomposes to generate nitrogen radical. Polymerization reaction of the nitrogen radical and TEOS takes place in vapor. Intermediate produced by the polymerization reaction is a TEOS polymer having a low molecular weight formed by n pieces of TEOS coupled. The TEOS polymer and nitrogen radical produced in the vapor are transported onto the surface of the first insulating film 3 having an uneven pattern, and, a further polymerization reaction takes place on the surface, thereby producing a film. The TEOS polymer having characteristics similar to liquid flows together in the step portion. This is the reason why the film possesses superior step coverage.

The resultant silicon-oxy-nitride film 100 includes nitrogen with a small atom radius and is therefore finer than "TEOS+$O_2$ plasma CVD silicon oxide film". As a result, the silicon-oxy-nitride film 100 has superior barrier capability to moisture etc. making an excellent protective insulating film depositing on interconnections.

Figure 8D:
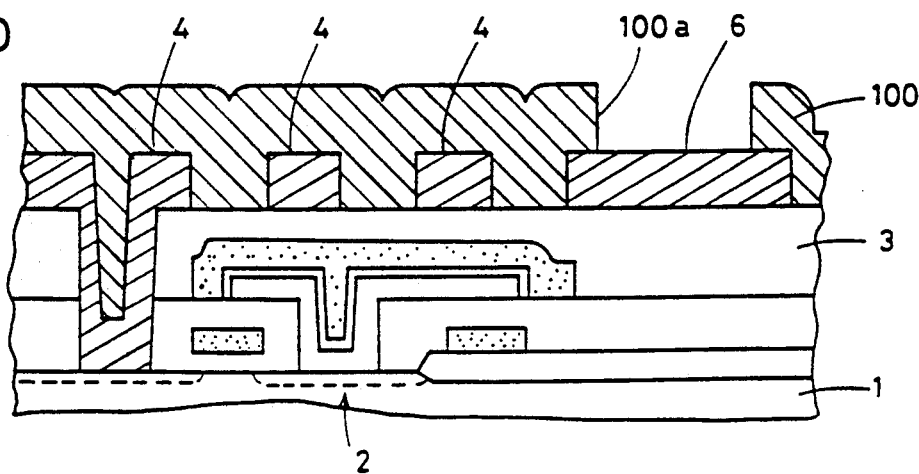

Referring to FIG. 8D, the protective insulating film 100 is provided with an opening 110a for exposing the bonding pad 6 by photolithography and etching methods.

Figure 1:
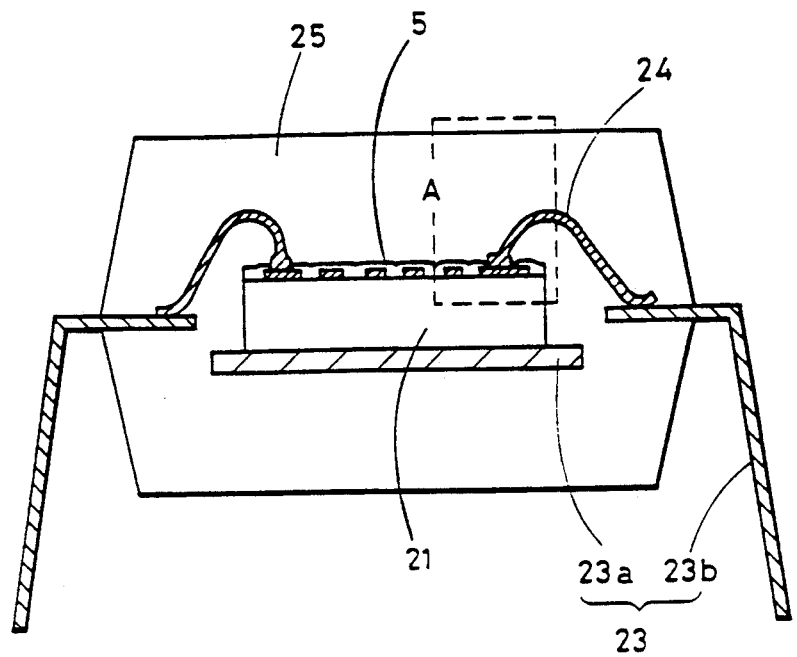
FIG. 1 is a sectional view showing a semiconductor device including a conventional mold resin sealing type package.
Figure 2:
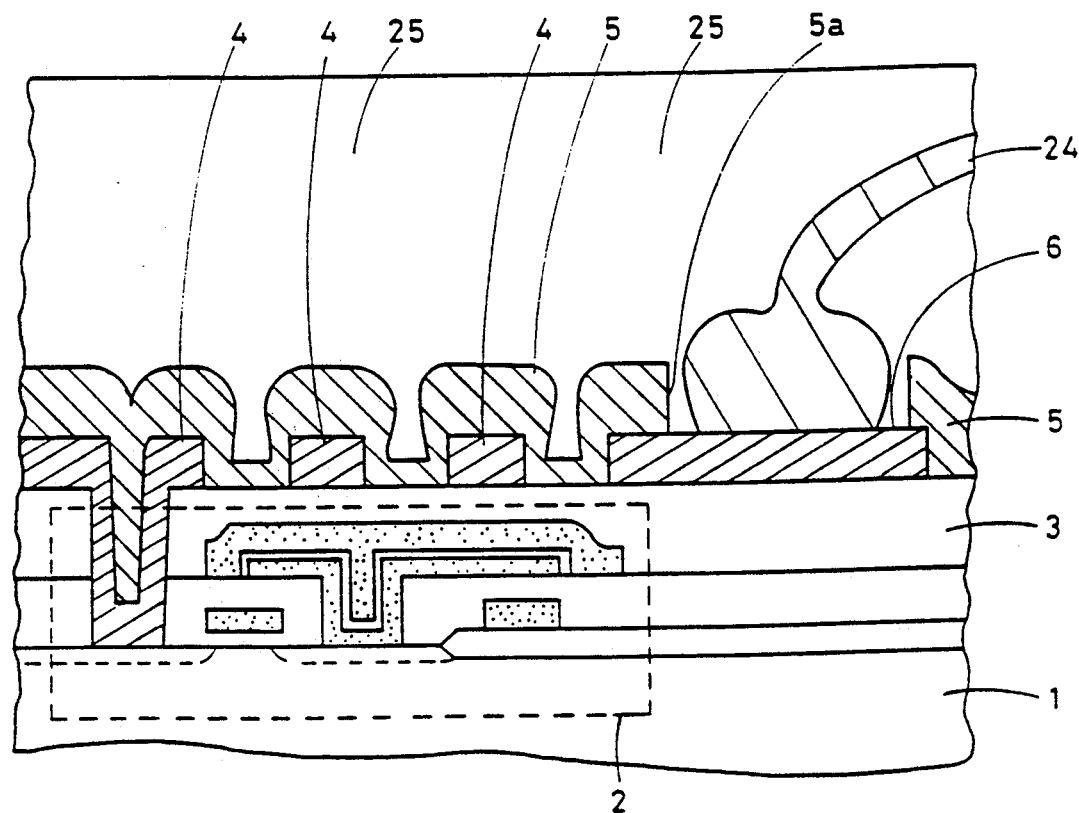
FIG. 2 is an enlarged view of A portion shown in FIG. 1.
Figure 3A:
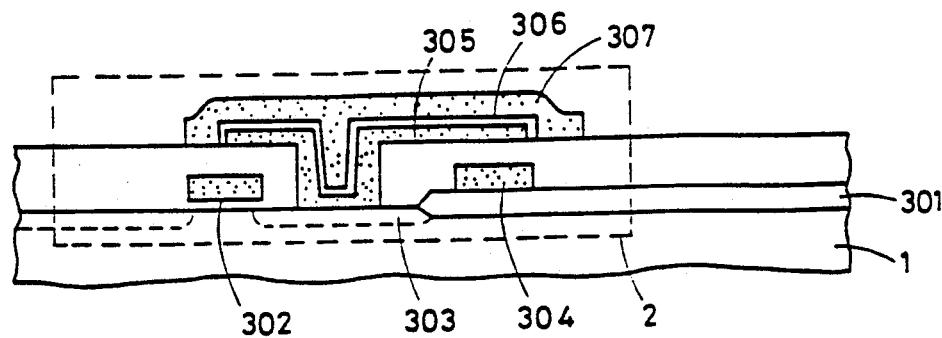
FIGS. 3A–3F are partially sectional views showing the semiconductor device shown in FIG. 2 in each step of the manufacturing method sequentially.
Figure 3B:
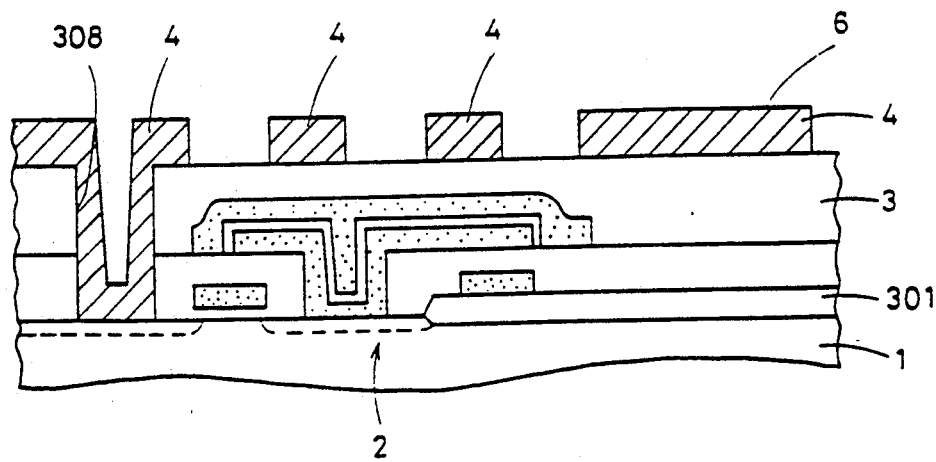
Figure 3C:
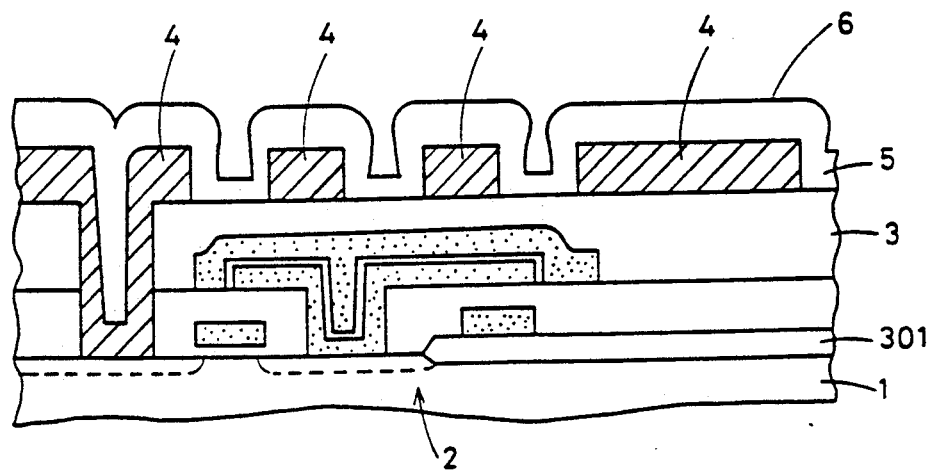
Figure 3D:
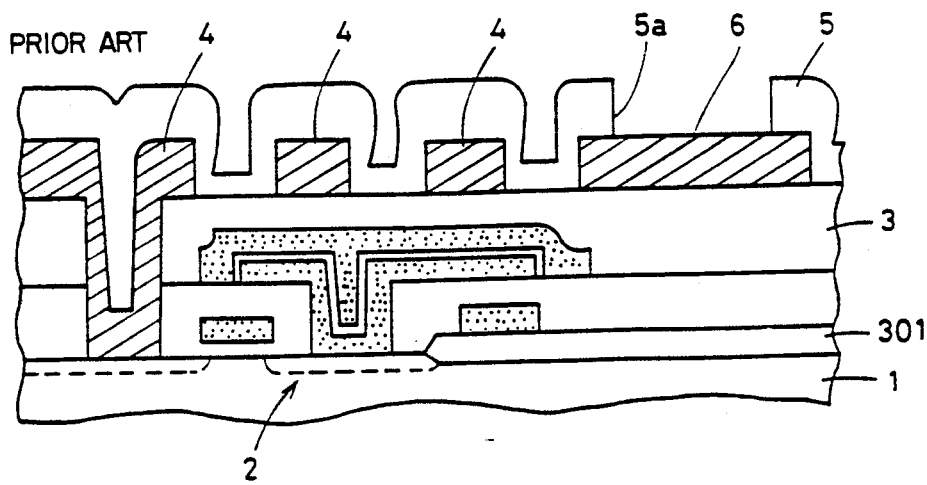
Figure 3E:
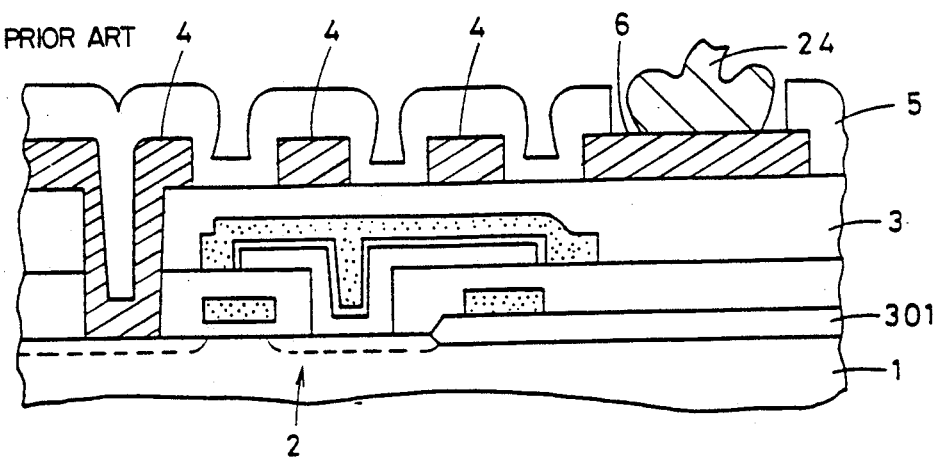
Figure 3F:
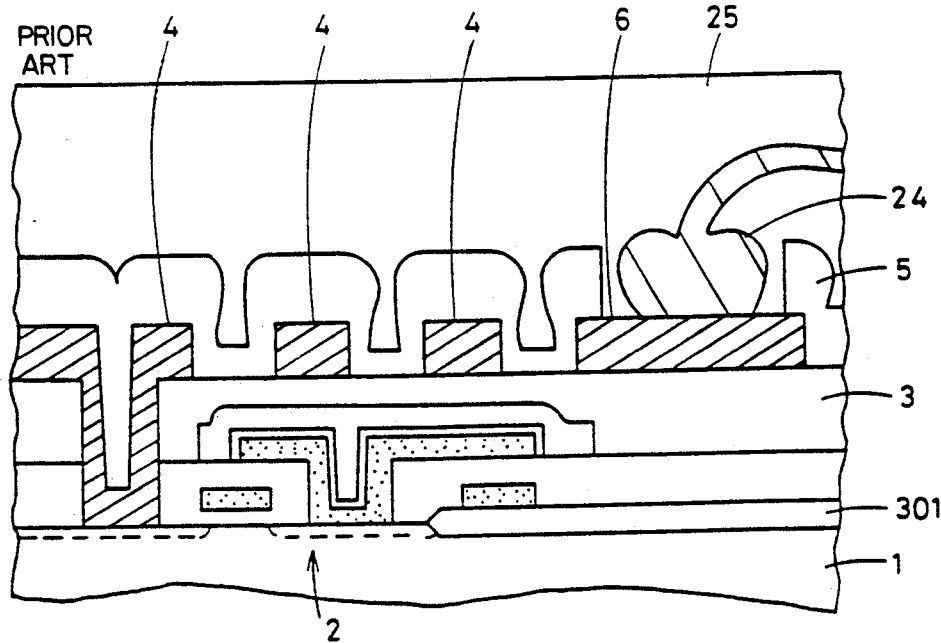
Figure 4:
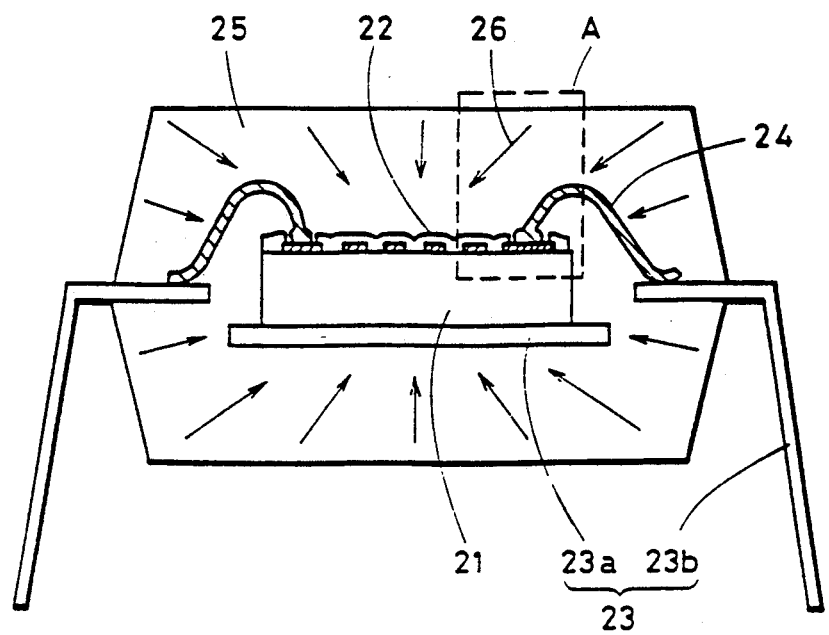
FIG. 4 is a view showing the concept of the problem in a semiconductor device including a conventional mold resin sealing type package.
Figure 5:
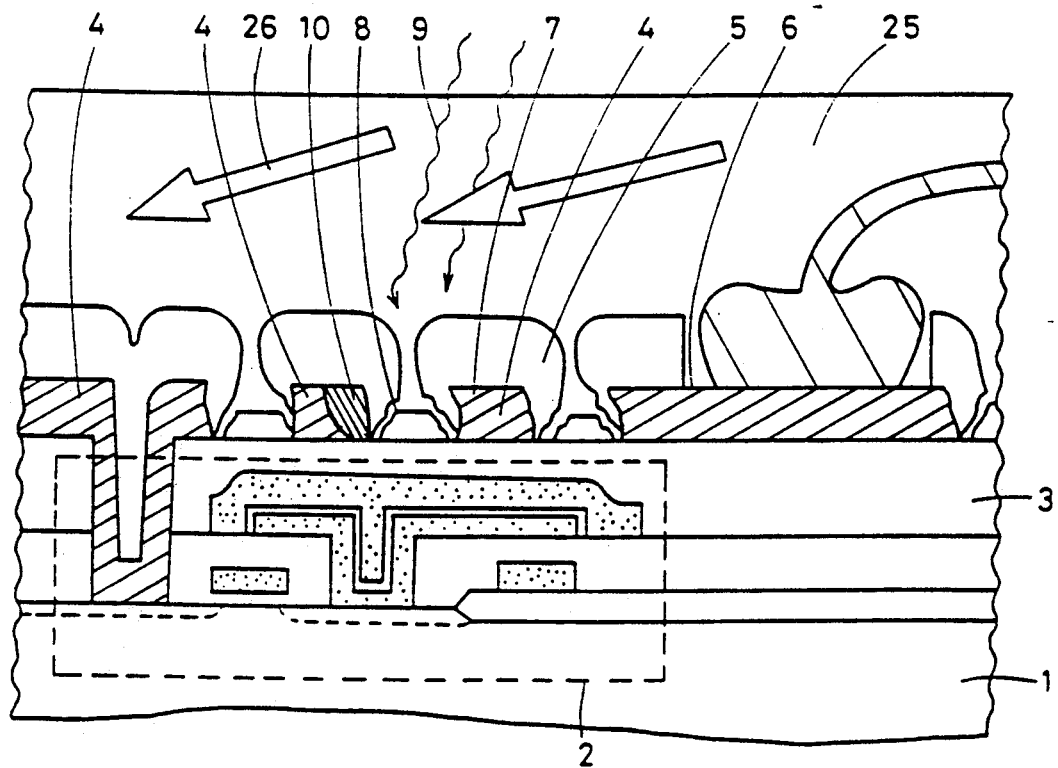
FIG. 5 is an enlarged view of A part in FIG. 4.
Figure 6A:
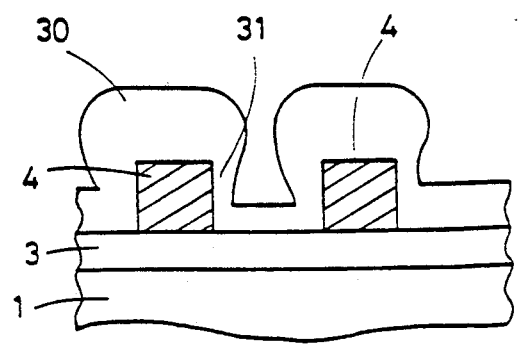
FIG. 6A is a view showing step coverage by "a SiH$_4$+N$_2$O plasma CVD silicon oxide film", FIG. 6B being a view showing the case in which the film thickness thereof is formed larger.
Figure 6B:
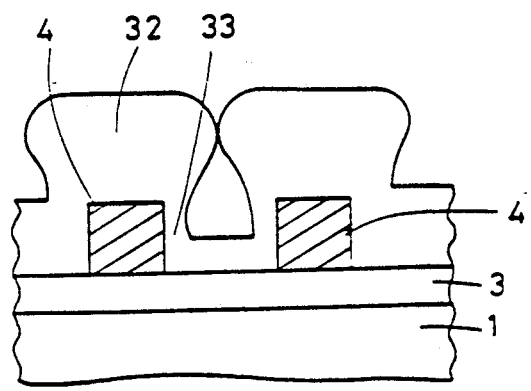
Figure 8E:
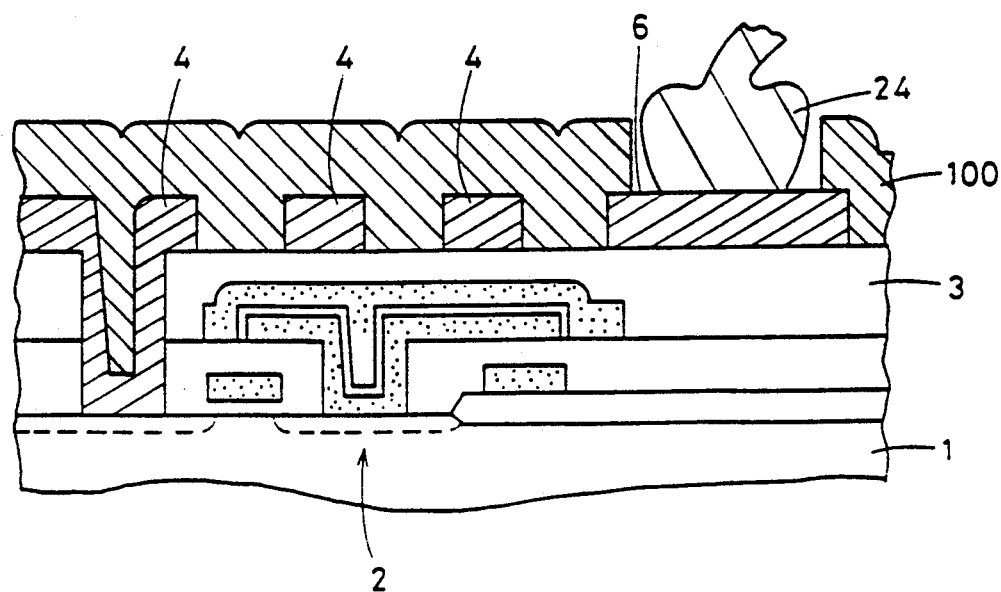
Figure 8F:
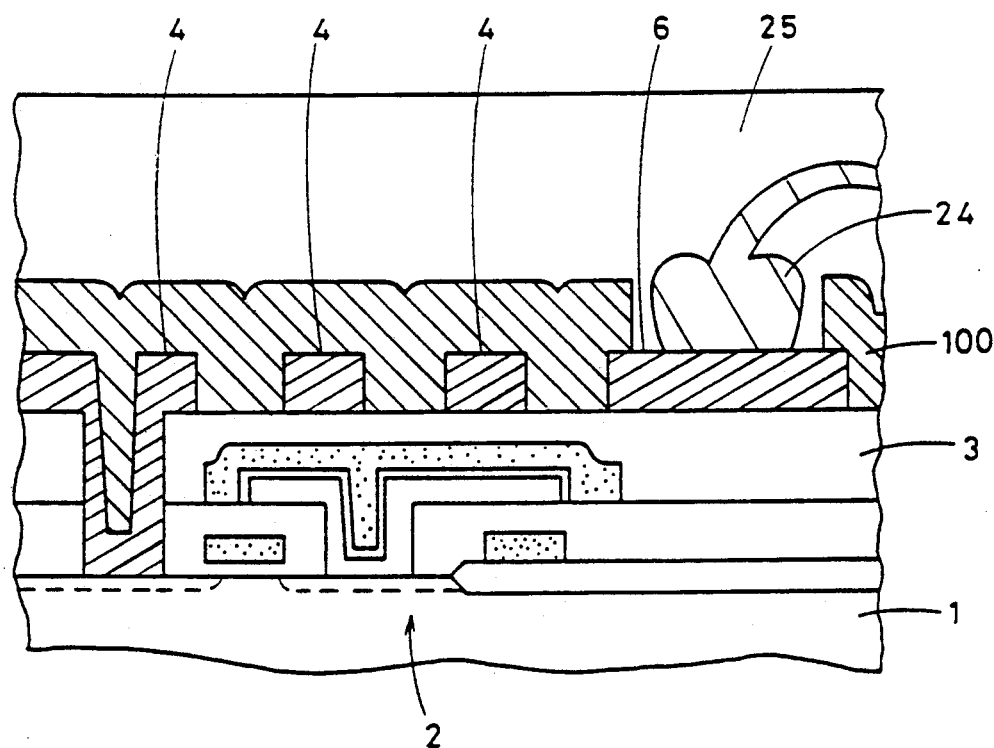

Referring to FIGS. 8E and 1, the silicon semiconductor substrate 1 on which elements are formed is severed by dicing to be as a semiconductor chip 21, and is then adhesively bonded to the die pad 23a of the lead frame 23 with solder or conductive adhesives.

Then, the bonding pad 6 and the lead 23b of the lead frame 23 are connected by a bonding wire 24.

Finally, the entire device is packaged by the mold resin 25.

Now further description will be given on how a protective insulating film is formed.

Figure 9:
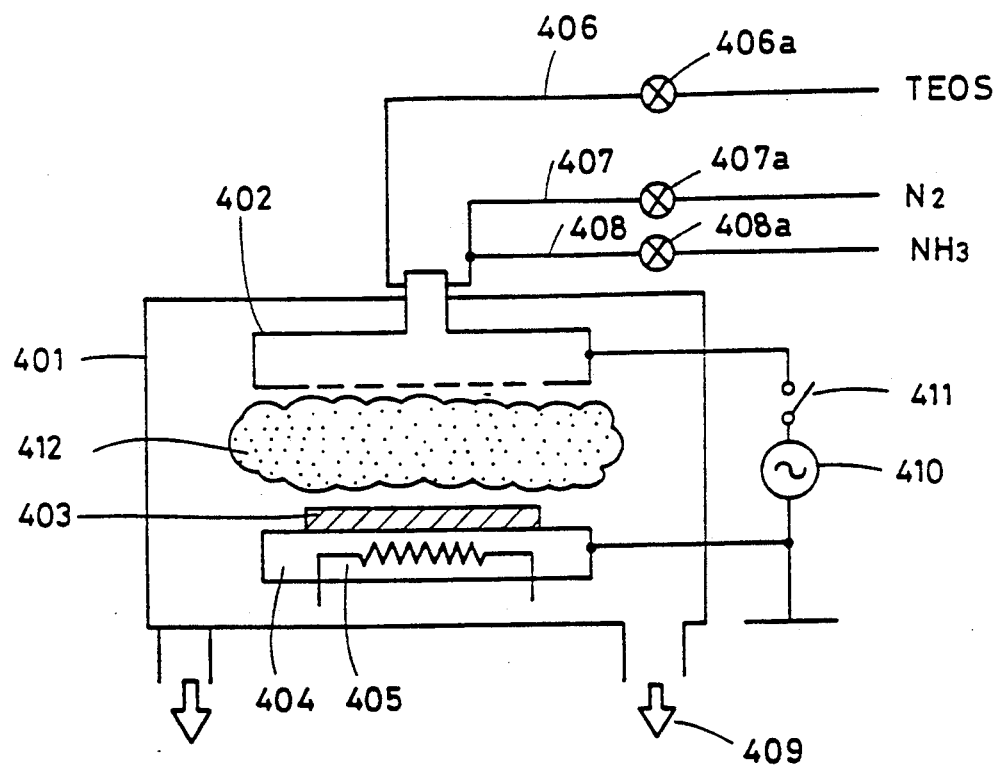
FIG. 9 is a view schematically showing a CVD device used in deposition of a protective insulating film.

FIG. 9 is a view showing a concept of a CVD device for depositing a silicon-oxy-nitride film, i.e. a protective insulating film. The CVD device includes a reaction chamber 401. The reaction chamber 401 includes a gas dispersion head. Provided in the reactive chamber 401 is a substrate holder 404 for holding a semiconductor substrate 403. Provided in the substrate holder 404 is a heater 405 for heating the semiconductor substrate 403 to a desired temperature. A TEOS gas supply line 406 including a valve 406a is connected to the gas dispersion head 402. Connected to the gas dispersion head 402 is a nitrogen gas supply line 407 including a valve 407a. An $NH_3$ gas supply line 408 including a valve 408a is connected to the gas dispersion head 402. The reactive chamber 401 is connected to a vacuum evacuation system 409. Connected to the gas dispersion head 402 and the substrate holder 404 is a high frequency power supply 410. The high frequency power supply 410 is turned ON/OFF by a high frequency power ON/OFF switch 411.

Now, description will be provided on the process of depositing a silicon-oxy-nitride film in accordance with the present invention using the above-described CVD device.

The semiconductor substrate 403 is disposed on the substrate holder 404, and is heated up to a desired temperature in the range, for example, from 300°–450° C. by the heater 405. Using the vacuum evacuation system 409, the reactive chamber 401 is evacuated up to a desired degree of vacuum, for example, to $10^{-4}$ Torr.

In case of depositing a TEOS+$NH_3$+$N_2$ plasma CVD silicon-oxy-nitride film, the valve 406a of the TEOS gas supply line, the valve 407a of the nitrogen gas supply line 407, the valve 408a of the $NH_3$ gas supply line 408 are each opened to supply a prescribed amount of gas to attain a pressure in the range from 10 to 100 Torr. Then the high frequency power ON/OFF switch 411 is turned on to supply radio frequency power from the high frequency power supply 410. A flow ratio of TEOS to $NH_3$ is preferably 1 : 10–1 : 30. RF power is preferably from 0.5–5 W/cm$^2$. A film is thus deposited taking advantage of the reaction in plasma 412 produced in the reactive chamber 401.

Although in the above described embodiment, all the protective insulating films are produced by "TEOS+$NH_3$+$N_2$ plasma CVD silicon-oxy-nitride film", stacked layer structures combined with other insulating films may be employed.

Figure 12:
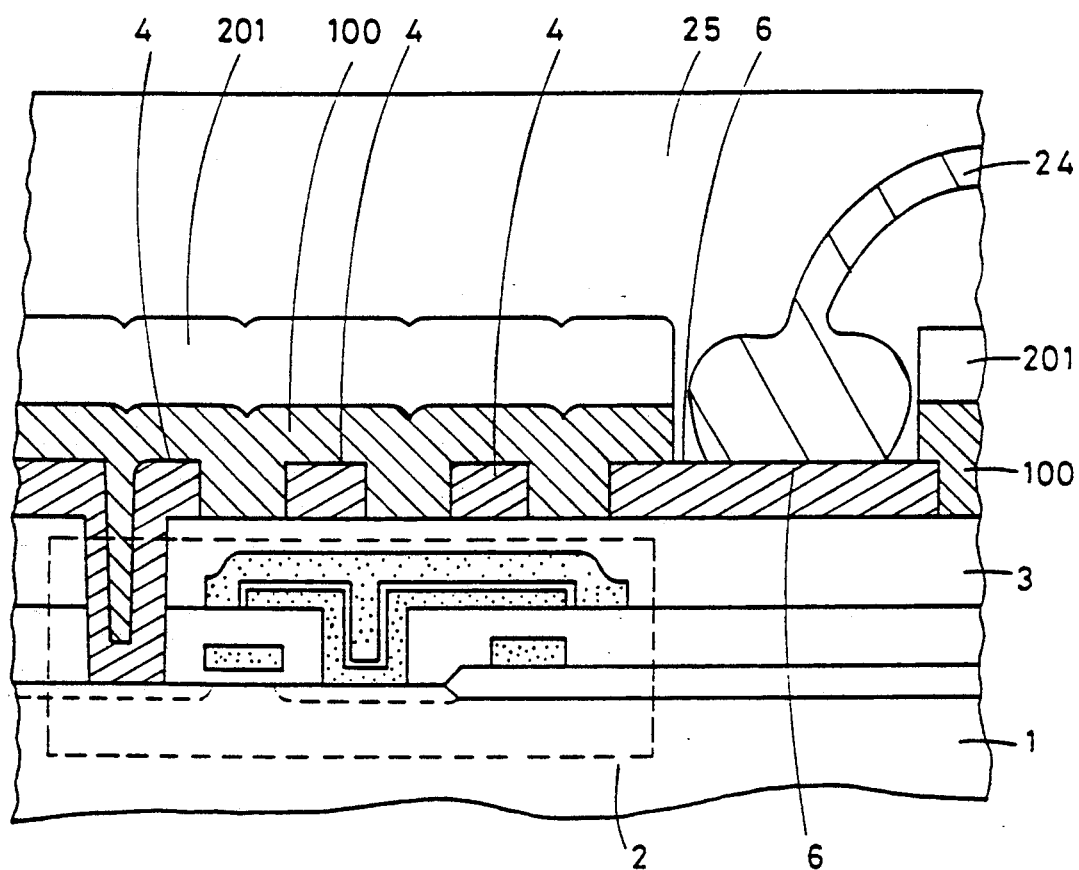
FIG. 12 is a sectional view showing a semiconductor device in accordance with another embodiment of the present invention.

FIG. 12 is a sectional view showing a semiconductor device in accordance with another embodiment of the present invention. Deposited on the first interconnection 4 is a "TEOS+$NH_3$+$N_2$ plasma CVD silicon-oxy-nitride film" 100. A "$SiH_4$+$NH_3$+$N_2$ plasma CVD silicon nitride film" 201 is deposited on the "TEOS+$NH_3$+$N_2$ plasma CVD silicon-oxy-nitride film" 100. The "TEOS+$NH_3$+$N_2$ plasma CVD silicon-oxy-nitride film" 100 preferably has a thickness in the range from 3000–10000 Å, the film thickness of the "$SiH_4$+$NH_3$+$N_2$ plasma CVD silicon nitride film" 201 being from 3000–10000 Å. The "$SiH_4$+$NH_3$+$N_2$ plasma CVD silicon nitride film" 201 is fine and has high moisture barrier characteristic. The moisture resistance of the semiconductor device can be further improved by covering the "TEOS+$NH_3$+$N_2$ plasma CVD silicon-oxy-nitride film" with the "$SiH_4$+$NH_3$+$N_2$ plasma CVD silicon-oxy-nitride film.

The above-described "$SiH_4$+$NH_3$+$N_2$ plasma CVD silicon nitride film" 201 has a large film stress of $2 \times 10^9$ dyn/cm$^2$ (compressibility), but if applied to a semiconductor device sensitive to this disadvantage, the following improvement will be added.

Figure 13:
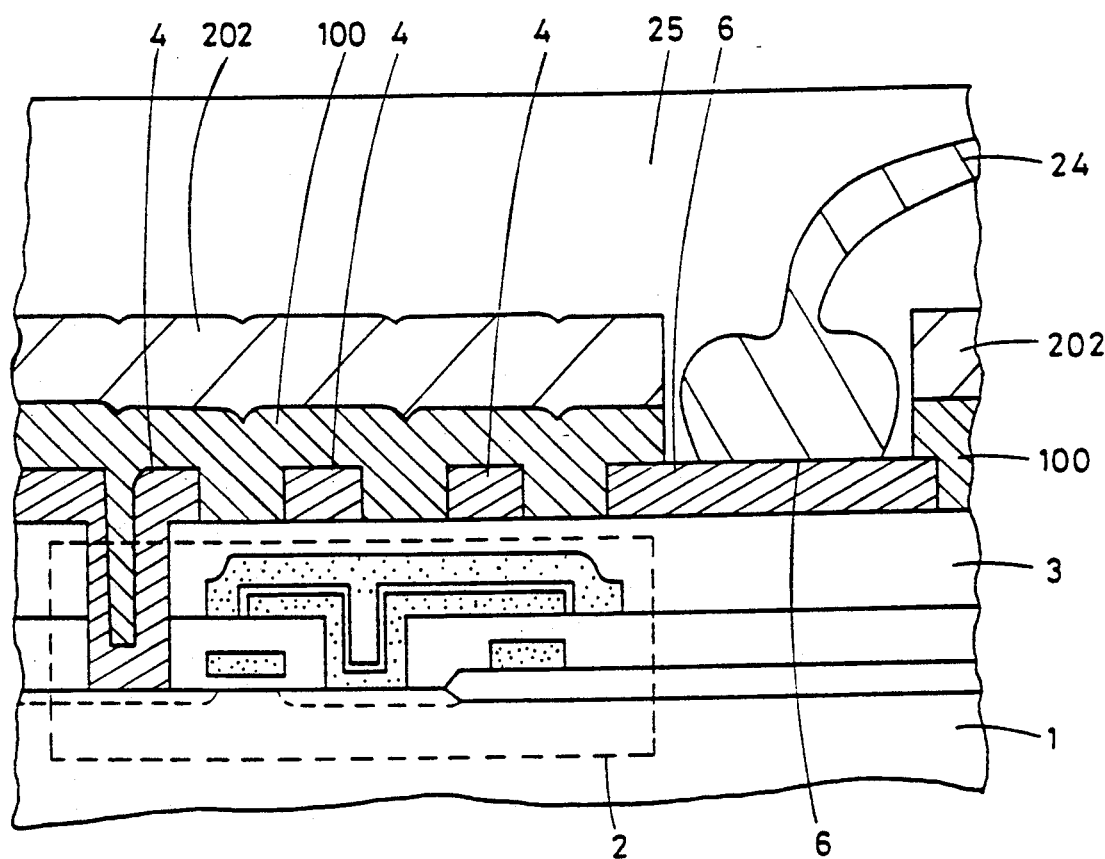
FIG. 13 is a sectional view showing a semiconductor device in accordance with a further embodiment of the present invention.
Figure 14:
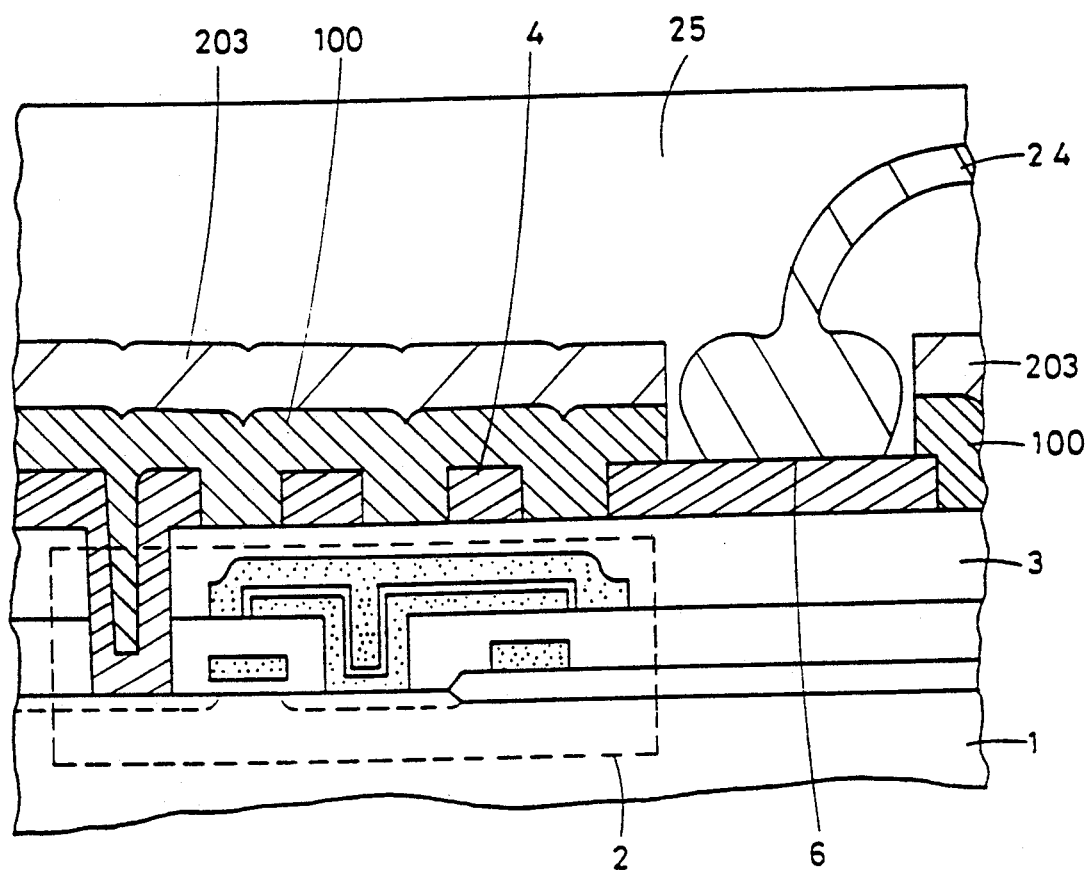
FIG. 14 is a sectional view showing a semiconductor device in accordance with yet another embodiment of the present invention.

FIG. 13 is a sectional view showing a semiconductor device in accordance with a further embodiment of the present invention. Referring to FIG. 13, a "TEOS+$NH_3$+$N_2$ plasma CVD silicon-oxy-nitride film" 100 is deposited over the first interconnection 4. Then, deposited on the "TEOS+$NH_3$+$N_2$ plasma CVD silicon-oxy-nitride film" 100 is a "$SiH_4$+$NH_3$+$N_2O$ plasma CVD silicon-oxy-nitride film 202. Alternatively, after depositing the first interconnection 4 and the "TEOS+$NH_3$+$N_2$ plasma CVD silicon-oxy-nitride film" 100, a "$SiH_4$+$N_2O$ plasma CVD silicon oxide film" 203 is deposited thereon. Having such a configuration, a semiconductor device having further superior moisture resistance can be provided.

Figure 15:
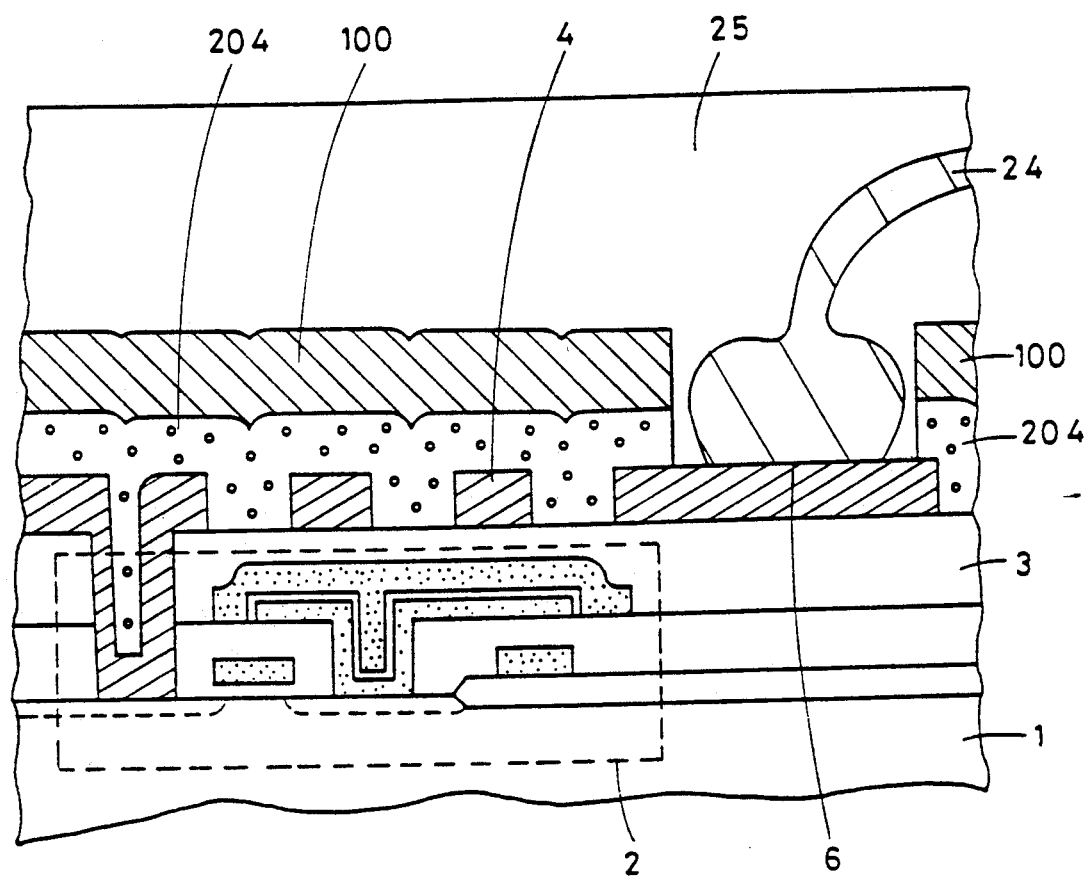
FIG. 15 is a sectional view showing a semiconductor device in accordance with still another embodiment of the present invention.

The dielectric constant of the "TEOS+$NH_3$+$N_2$ plasma CVD silicon-oxy-nitride film" is approximately from 4 to 5, and if this can be a disadvantage in a semiconductor device which requires high speed operation, the following improvement may be added. That is, referring to FIG. 15, formed on the underlying layer of "TEOS+$NH_3$+$N_2$ plasma CVD silicon-oxy-nitride film" 100 is a silicon oxide film 204 having a smaller dielectric constant of 3 to 4 than the silicon-oxy-nitride film. In the above case, the silicon oxide film 204 is formed of a "TEOS+$O_2$ plasma CVD silicon oxide film" because excellent step coverage is required. Having such a configuration, an insulating film between interconnections mainly determining capacitance between interconnections which is essential to high speed operation, is formed of a "TEOS+$O_2$ plasma CVD silicon oxide film" having a small dielectric constant, and, therefore, a semiconductor device capable of high speed operation can be produced. Also, with the "TEOS+$NH_3$+$N_2$ plasma CVD silicon-oxy-nitride film" 100 covering "TEOS+$O_2$ plasma CVD silicon oxide film" 204, as described above, a semiconductor device having superior reliability such as moisture resistance can be produced.

Figure 16:
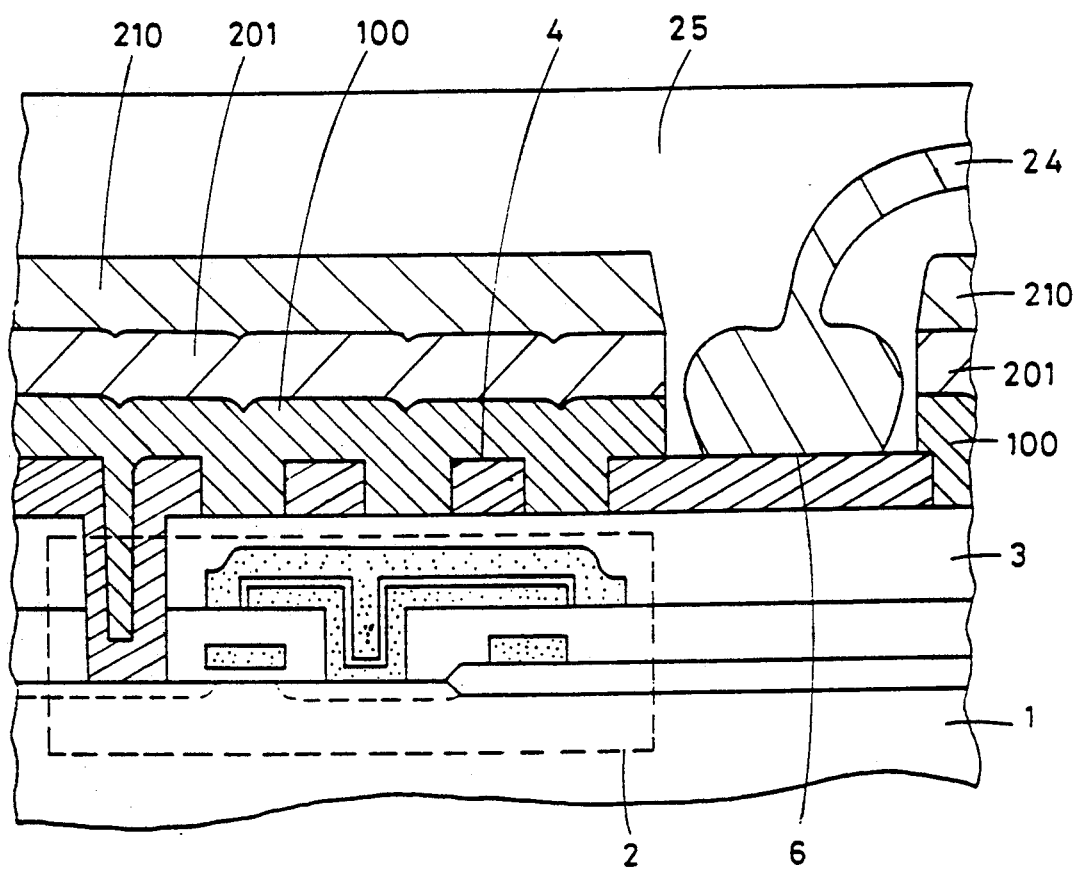
FIG. 16 is a sectional view showing a semiconductor device in accordance with an additional embodiment of the present invention.

FIG. 16 is a sectional view showing a semiconductor device in accordance with a further embodiment of the present invention. Referring to FIG. 16, formed on a protective insulating film formed by a stack of a "TEOS+NH₃+N₂ plasma CVD silicon-oxy-nitride films" 100 and a "SiH₄+NH₃+N₂ plasma CVD silicon nitride film" 201 is a buffer coat film 210 formed of polyimide resin, silicon ladder polymer resin, etc. The existence of the buffer coat film 210 allows increase in the mechanical strength of the semiconductor substrate.

Although in the above-described embodiments, the cases have been described in which TEOS is employed as an example of organic silane, other organic silane, for example, tetra methoxy silane, tetra isopropoxy silane, di-tertiary butoxy acetoxy silane, etc. may be used to produce similar effects.

Also in the above-described embodiment, the case has been described in which the interconnection structure is of a single layer and the first interconnection is of an aluminum interconnection, the same effects can be achieved when the first interconnection is of other metal interconnections such as high melting point metals (W, Mo, Ti, etc.), high melting point metal silicides (WSi₂, MoSi₂, TiSi₂, etc.) interconnections or polysilicon interconnections are employed. Also, these interconnection structures can be of multilayer structures.

Also in the above-described embodiments, the silicon-oxy-nitride film is deposited in accordance with the plasma CVD method using organic silane (TEOS) and a nitriding gas (nitrogen, ammonia), oxidizing gas of such as oxygen or ozone may be added to these gas to form a silicon-oxy-nitride film for increasing the degree of oxidation of the film, when the dielectric constant of the silicon-oxy-nitride film is desired to be further reduced, so that the same effects can be obtained.

Also in the above-described embodiments, the case has been described in which the present invention is applied to a semiconductor device having DRAM elements formed in the surface of the semiconductor substrate, the same effects can be obtained if applied to other semiconductor devices.

Figure 17:
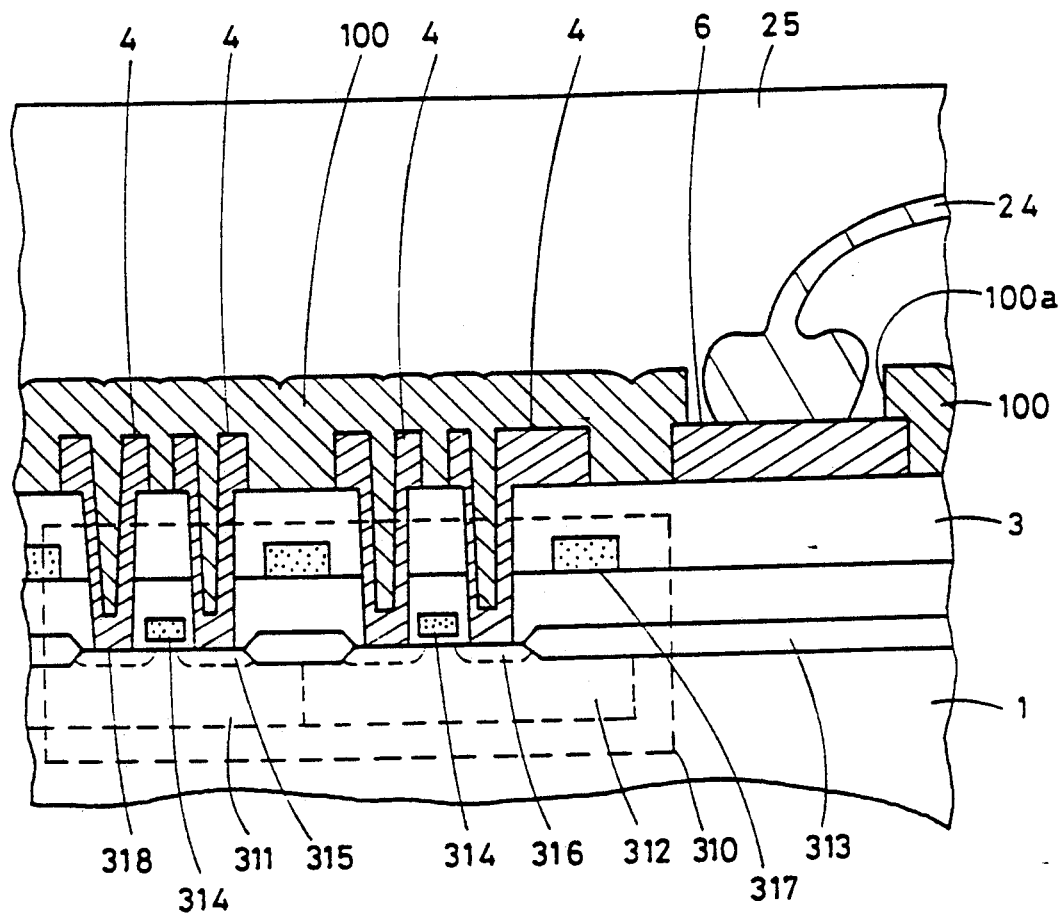
FIG. 17 is a sectional view showing a semiconductor device in accordance with a further additional embodiment of the present invention.

FIG. 17 is a sectional view showing a semiconductor device on which SRAM elements are formed on the surface of the semiconductor substrate. Referring to FIG. 17, an SRAM element 310 is formed on the surface of a silicon semiconductor substrate 1. The SRAM element 310 includes a P type well region 311 and an N type well region 312 formed on an active region isolated by an element isolation oxide film 313. Formed on the main surface of the P type well region 312 is an N type impurity diffusion layer 315. Formed on this main surface of the N type well region 312 is a P type impurity diffusion layer 316. In each upper portion of the P type well region 311 and the N type well region 312, a gate electrode 314 is formed. The SRAM element 310 includes a polysilicon interconnection 317 provided in each upper portion of the P type well region 312 and the N type well region 312. A first insulating film 3 is formed so as to cover the SRAM element 310. On the first insulating film 3 a first interconnection 4 is formed. The first interconnection 4 includes a bonding pad 6. A "TEOS+NH₃+N₂ plasma CVD silicon-oxy-nitride film" 100 which is a protective insulating film is formed so as to cover the first interconnection 4. An opening 100a for exposing the bonding pad 6 is formed in the "TEOS+NH₃+N₂ plasma CVD silicon-oxy-nitride films" 100. A bonding wire 24 is connected to the bonding pad 6. The present semiconductor device is entirely packaged by mold resin sealing agent 25. A semiconductor device having such a configuration achieves the same effects as the above described embodiments. Elements other than DRAM elements and SRAM elements, for example, EPROM elements, E² PROM elements, microcomputer circuit elements, CMOS logic circuit elements, bipolar transistor elements, etc. can be formed on the surface of a semiconductor substrate. As in the foregoing, in a semiconductor device in accordance with the present invention, the mechanical strength of a protecting insulating film can be increased to a level enough to withstand compressive stress by mold resin. Consequently, mechanical deformation of interconnections, or cracks in the protective insulating film due to the deformation can be prevented. A silicon-oxy-nitride film is fine compared to a silicon oxide film, and, therefore has a superior barrier characteristic to moisture coming in from the outside. A semiconductor device superior in reliability such as moisture resistance can therefore be produced.

In the manufacturing method of a semiconductor device in accordance with another aspect of the present invention, a protective insulating film is deposited by a CVD method using plasma, using a mixture gas including organic silane and a nitriding gas, and by the method, a film deposition reaction, which is one characteristic of the process of film formation using organic silane, takes place mainly on the surface of the substrate, thereby achieving superior step coverage. Therefore, if the film is deposited over an aluminum interconnection, the thickness of the protective insulating film in the uneven portion can be increased enough to withstand compressive stress by mold resin. As a result, mechanical deformation of the aluminum interconnection, and cracks produced in the protective insulating film due to the deformation can be prevented. The film, including a silicon-oxy-nitride film which includes N atoms having a small radius, is finer compared to a silicon oxide film, and, therefore, has superior barrier characteristic to moisture coming in from the outside. Consequently, a semiconductor device which is superior in reliability such as moisture resistance, etc. can be produced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device having a protective insulating film, comprising:
   a semiconductor substrate on which elements are formed;
   an interconnection pattern provided on said semiconductor substrate and electrically connected with said elements; and
   a silicon-oxy-nitride film provided on said semiconductor substrate so as to cover said interconnection pattern and including 0.01–0.5 wt % of hydroxyl group.

2. The semiconductor device in accordance with claim 1, further comprising a silicon nitride film provided on said silicon-oxy-nitride film and deposited in accordance with the plasma chemical vapor deposition method using a mixture gas including silane and a nitriding gas.

3. The semiconductor device in accordance with claim 2, wherein the film thickness of said silicon-oxy-nitride film ranges from 3000 to 10000 Å, and the film thickness of said silicon nitride film ranges from 3000 to 10000 Å.

4. The semiconductor device in accordance with claim 1, further comprising a second silicon-oxy-nitride film which has no hydroxyl group.

5. The semiconductor device in accordance with claim 4, wherein said second silicon-oxy-nitride film is deposited in accordance with a plasma chemical vapor deposition method, using a mixture gas including silane, a nitriding gas and an oxidizing gas.

6. The semiconductor device in accordance with claim 1 further comprising a silicon oxide film provided on said silicon-oxy-nitride film.

7. The semiconductor device in accordance with claim 6, wherein said silicon oxide film is formed in accordance with a chemical vapor deposition method which uses plasma or heat, using a mixture gas including silane and an oxidizing gas.

8. The semiconductor device in accordance with claim 6, wherein said silicon oxide film is formed in accordance with a chemical vapor deposition method which uses plasma or heat, using a mixture gas including organic silane and an oxidizing gas.

9. A semiconductor device having a protective insulating film, comprising:
- a semiconductor substrate on which elements are formed;
- an interconnection pattern provided on said semiconductor substrate and electrically connected with said elements;
- a silicon oxide film provided on said semiconductor substrate so as to cover said interconnection pattern; and
- a silicon-oxy-nitride film provided on said silicon oxide film and including 0.01–0.5 wt % of hydroxyl group.

10. The semiconductor device in accordance with claim 9, wherein said silicon oxide film is formed in accordance with a plasma chemical vapor deposition method using organic silane and an oxidizing gas.

11. A semiconductor device having a protective insulating film, comprising:
- a semiconductor substrate on which elements are formed;
- an interconnection pattern provided on said semiconductor substrate and electrically connected with said elements;
- a silicon-oxy-nitride film provided on said semiconductor substrate so as to cover said interconnection pattern and including 0.01–0.5 wt % of hydroxyl group; and
- a buffer coat film provided on said silicon-oxy-nitride film for relaxing stress.

* * * * *